(12) United States Patent
Lin et al.

(10) Patent No.: US 11,322,852 B2
(45) Date of Patent: May 3, 2022

(54) LENS ANTENNA PACKAGING STRUCTURE, PREPARATION METHOD AND ELECTRONIC DEVICE

(71) Applicant: SJ SEMICONDUCTOR (JIANGYIN) CORPORATION, JiangYin (CN)

(72) Inventors: Jangshen Lin, JiangYin (CN); Chengchung Lin, JiangYin (CN); Yenheng Chen, JiangYin (CN); Chengtar Wu, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 21 days.

(21) Appl. No.: 17/133,059

(22) Filed: Dec. 23, 2020

(65) Prior Publication Data
US 2021/0203078 A1 Jul. 1, 2021

(30) Foreign Application Priority Data

Dec. 25, 2019 (CN) .......................... 201911359984.1
Dec. 25, 2019 (CN) .......................... 201922378283.4

(51) Int. Cl.
*H01Q 1/00* (2006.01)
*H01Q 19/06* (2006.01)
*H01Q 1/50* (2006.01)
*H01Q 1/42* (2006.01)

(52) U.S. Cl.
CPC ............. *H01Q 19/062* (2013.01); *H01Q 1/42* (2013.01); *H01Q 1/50* (2013.01)

(58) Field of Classification Search
None
See application file for complete search history.

(56) References Cited

U.S. PATENT DOCUMENTS

| | | | |
|---|---|---|---|
| 7,486,239 B1 * | 2/2009 | Channabasappa ... | H01Q 9/0414 343/700 MS |
| 2007/0026567 A1 * | 2/2007 | Beer ........................ | H01Q 1/44 257/E23.114 |
| 2010/0328189 A1 * | 12/2010 | Laknin ............. | G06K 19/07749 361/767 |

* cited by examiner

*Primary Examiner* — Trinh V Dinh
(74) *Attorney, Agent, or Firm* — Alston & Bird LLP (57) ABSTRACT

The present disclosure provides a lens antenna packaging structure, a preparation method and an electronic device. The lens antenna packaging structure includes a rewiring layer stack, a feeder line, a plastic encapsulation layer, an antenna, a lens, a chip and a protruded solder ball. The lens covers the antenna, such that one or a combination of the spherical beam and the cylindrical beam radiated initially from the antenna will be refracted by the lens into a desired shape, to improve the directivity of the beam through the lens, which can enhance the directional gain of electromagnetic waves through the lens, reduce the attenuation and loss of the electromagnetic waves of the antenna, and produce a significant energy saving for 5G base stations and terminals.

16 Claims, 8 Drawing Sheets

LENS ANTENNA PACKAGING STRUCTURE, PREPARATION METHOD AND ELECTRONIC DEVICE

CROSS REFERENCE TO RELATED APPLICATION

The present application is related to and claims the benefit of priority to Chinese Patent Application No. CN2019113599841, entitled "Lens Antenna Packaging Structure, Preparation Method and Electronic Device", filed with CNIPA on Dec. 25, 2019, and Chinese Patent Application No. CN2019223782834, entitled "Lens Antenna Packaging Structure and Electronic Device", filed with CNIPA on Dec. 25, 2019, the contents of which are incorporated herein by reference in their entirety.

TECHNICAL FIELD

The present disclosure relates to the technical field of semiconductor device packaging, in particular, to a lens antenna packaging structure, a preparation method and an electronic device.

DESCRIPTION OF RELATED ARTS

Most advanced electronic products have wireless communication functions to meet the increasing demands from people, especially for mobile devices.

The transmission and reception of antenna signals usually need to pass through multiple functional chip modules. One of the traditional methods is to assemble functional chip modules on a printed circuit board (PCB) board for PCB packaging. However, in an antenna packaging structure prepared by the PCB packaging method, the transmission lines of the antenna signals are long, leading to poor performance, high power consumption, and bulky packaging volume, unmatched to the high-speed, convenient and lightweight electronic products under the packaging in the electronic devices that people are pursuing.

The rapid development of 5th Generation (5G) communication has challenged the device antenna's capability at high-frequency electromagnetic wave transmission, current devices show large transmission attenuation and high loss at the millimeter electromagnetic waves.

Therefore, it is important to develop a new type of lens antenna packaging structure, a method to make it, and an integrated electronic device to reduce the attenuation and loss of the antenna at the millimeter electromagnetic radiation.

SUMMARY

The present disclosure provides a lens antenna packaging structure, a preparation method and an electronic device, to reduce attenuation and loss of electromagnetic waves of the antenna.

A lens antenna packaging structure, including: a rewiring layer stack, including a first side and a second side opposite to the first side; a feeder line disposed on the first side of the rewiring layer stack, the feeder line includes a first end electrically connected with the rewiring layer stack and a second end opposite to the first end; a plastic encapsulation layer disposed on the first side of the rewiring layer stack, encapsulating the feeder line and exposing the second end of the feeder line; an antenna disposed on a surface of the plastic encapsulation layer away from the rewiring layer stack, the antenna is electrically connected to the second end of the feeder line and emits an initial beam of electromagnetic waves; a lens disposed on an outer surface of the antenna away from the plastic encapsulation layer, the lens refracts the initial beam to an output beam of a desired shape; a chip flip-chip bonded to the second side of the rewiring layer stack and electrically connected to the rewiring layer stack; and a protruded solder ball disposed on the second side of the rewiring layer stack and electrically connected with the rewiring layer stack.

In some examples, the initial beam of electromagnetic waves includes one or a combination of a spherical form and a cylindrical form, and the initial beam is refracted into a planar beam through the lens.

In some examples, the antenna includes one ora combination of a transmitting antenna, a receiving antenna, and a transceiver antenna.

In some examples, the lens includes a convex lens with a refractive index ranging from 1.1 to 2.0.

In some examples, the lens includes one ora combination of a PI lens, a silicone lens, a PMMA lens, a PET lens, and a PC lens.

In some examples, a foot print of the lens on the plastic encapsulated layer includes one or a combination of a circle, an ellipse, a square, a triangle, and a trapezoid.

In some examples, a metal connector is disposed between the feeder line and the rewiring layer stack and electrically connecting the rewiring layer stack and the feeder line.

In another embodiment of the disclosure, an electronic device includes a lens antenna packaging structure, the lens antenna packaging structure includes: a rewiring layer stack, including a first side and a second side opposite to the first side; a feeder line disposed on the first side of the rewiring layer stack, the feeder line includes a first end electrically connected with the rewiring layer stack and a second end opposite to the first end; a plastic encapsulation layer disposed on the first side of the rewiring layer stack, encapsulating the feeder line and exposing the second end of the feeder line; an antenna disposed on a surface of the plastic encapsulation layer away from the rewiring layer stack, the antenna is electrically connected to the second end of the feeder line and emits an initial beam of electromagnetic waves; a lens disposed on an outer surface of the antenna away from the plastic encapsulation layer, the lens refracts the initial beam to an output beam of a desired shape; a chip flip-chip bonded to the second side of the rewiring layer stack and electrically connected with the rewiring layer stack; and a protruded solder ball disposed on the second side of the rewiring layer stack and electrically connected with the rewiring layer stack.

Another embodiment provides a method for making a lens antenna packaging structure, including: providing a support substrate, forming a separation layer on the support substrate; forming a rewiring layer stack on the separation layer, the rewiring layer stack includes a second side in contact with the separation layer and a first side opposite to the second side; forming a feeder line on the first side of the rewiring layer stack, the feeder line includes a first end electrically connected with the rewiring layer stack and a second end opposite to the first end; forming a plastic encapsulation layer on the first side of the rewiring layer stack, the plastic encapsulation layer encapsulates the feeder line and exposes the second end of the feeder line; forming an antenna on a surface of the plastic encapsulation layer away from the rewiring layer stack, the antenna is electrically connected with the second end of the feeder line and emits an initial beam of electromagnetic waves; forming a lens on an outer surface of the plastic encapsulation layer away from the rewiring layer stack, the lens refracts the initial beam to a desired shape; removing the separation layer and the support substrate to expose the second side of the rewiring layer stack; flip-chip bonding a chip to the second side of the rewiring layer stack, the chip is electrically connected with the rewiring layer stack; and forming a protruded solder ball on the second side of the rewiring layer stack, the protruded solder ball is electrically connected with the rewiring layer stack.

In some examples, the method of forming the lens includes one ora combination of 3D lithography, laser etching, and molding.

In some examples, the initial beam of electromagnet waves from the antenna includes one or a combination of a spherical beam and a cylindrical beam, and the initial beam is converted into a planar beam through the lens.

In some examples, the antenna includes one ora combination of a transmitting antenna, a receiving antenna, and a transceiver antenna.

In some examples, the lens includes a convex lens with a refractive index ranging from 1.1 to 2.0 for the electromagnet waves in the initial beam.

In some examples, the formed lens includes one or a combination of a PI lens, a silicone lens, a PMMA lens, a PET lens, and a PC lens.

In some examples, a foot print of the lens on the plastic encapsulated layer includes one or a combination of a circle, an ellipse, a square, a triangle, and a trapezoid.

In some examples, the method further includes: forming a metal connector after forming the rewiring layer stack and before forming the feeder line, to electrically connect the rewiring layer stack and the feeder line through the metal connector.

DESCRIPTION OF COMPONENT MARK NUMBERS

100 Support substrate
110 Separation layer
121 First wiring dielectric layer
122 Second wiring dielectric layer
123 Third wiring dielectric layer
130 Seed layer
131 Ti layer
132 Cu layer
141 First wiring metal layer
142 Second wiring metal layer
143 Third wiring metal layer
150 Metal connector
151 Ni layer
152 Au layer
160 Feeder line
170 Plastic encapsulation layer
180 Antenna
190 Lens
200 Chip
210 Filling layer
220 Protruded Solder ball
300 Mask
400 Light

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-19. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

Figure 17:
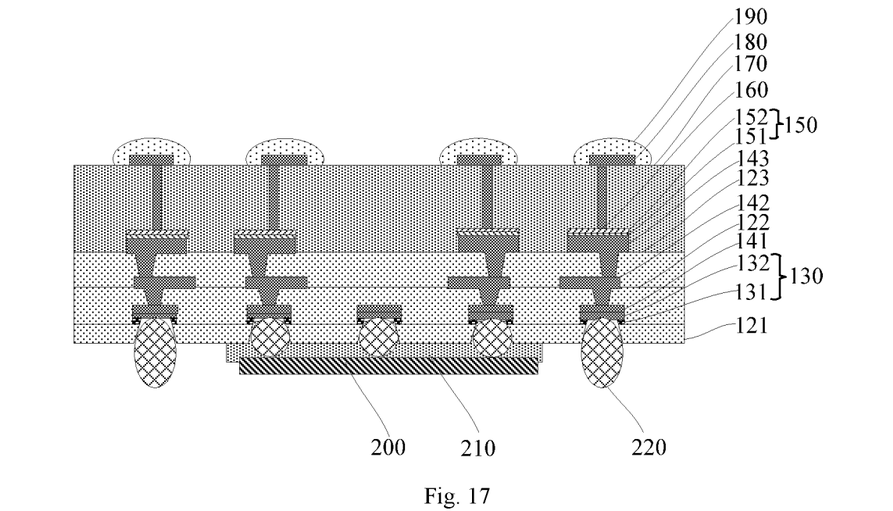

Referring to FIG. 17, the present disclosure provides a lens antenna packaging structure, which includes a rewiring layer stack (see explanation below), a feeder line 160, a plastic encapsulation layer 170, an antenna 180, a lens 190, a chip 200 and a protruded solder ball 220.

Specifically, the rewiring layer stack includes a first side and a second side opposite to the first side. The feeder line 160 is disposed on the first side of the rewiring layer stack, and the feeder line 160 includes a first end electrically connected with the rewiring layer stack and a second end opposite to the first end. The plastic encapsulation layer 170 is disposed on the first side of the rewiring layer stack, encapsulates the feeder line 160 and exposes the second end of the feeder line 160. The antenna 180 is disposed on a surface of the plastic encapsulation layer 170 facing away from the rewiring layer stack and is electrically connected with the second end of the feeder line 160. The lens 190 is disposed on a surface of the plastic encapsulation layer 170 facing away from the rewiring layer stack, and the lens 190 covers the antenna 180 to improve the directivity of the electromagnetic beam through the lens 190. The chip 200 is flip-chip bonded to the second side of the rewiring layer stack and is electrically connected with the rewiring layer stack. The protruded solder ball 220 is disposed on the second side of the rewiring layer stack and is electrically connected with the rewiring layer stack.

The lens antenna packaging structure according to the present disclosure covers the lens 190 on top of the antenna 180. The electromagnetic beam is refracted to converge when passing through the lens 190. Thus the directivity of the beam is improved through the lens 190, so that the directional gain of the electromagnetic wave can be enhanced by the lens 190. As a result, the attenuation and loss of the electromagnetic wave of the antenna can be reduced.

As an example, the beam includes one or a combination of a spherical beam and a cylindrical beam, and the beam is converted into a plane beam through the lens 190.

Specifically, according to different wavefront shapes, beams emitted by different wave sources can be characterized as one or a combination of plane beams, cylindrical beams, and spherical beams. Among them, a beam that its wavefront is a plane surface with rays parallel to each other is called a plane beam. The plane beam does not diverge out, and the intensity of the plane beam does not change with distance from the lens (within the limit of diffraction and at a reasonable short distance). A beam that its wavefront is a coaxial cylindrical surface is called a cylindrical beam. The cylindrical beam spreads circumferentially but does not spread along the axis of the lens. The intensity of the cylindrical beam at a distance away from the lens is inversely proportional to the square root of the distance A beam that its wavefront is a concentric spherical surface is called a spherical beam. The spherical beam spreads in all directions, and the intensity of the spherical beam is inversely proportional to the squared distance from the lens. According to the theory of geometric optics, when the wave propagates in two media with different refractive indexes, refraction at the border occurs. During the transmission of the electromagnetic wave, when the electromagnetic wave passes through the border between two media that have different refractive indexes, the electromagnetic wave will refract, from a first medium of a lower refractive index into a second medium of a higher refractive index, to the beam will travel with a smaller angle (Snell's law) which is like light passing a converging lens. In this embodiment, by arranging the properly curved lens 190 in front of the antenna 180, the beam is refracted when passing through the lens 190, so as to achieve a convergence effect on the beam, such that the directivity of the beam is improved through the lens 190, and the directional gain of electromagnetic waves can be enhanced by the lens 190. The beam may include one or a combination of a spherical beam, a cylindrical beam, or another shaped beam, which is specifically determined by the wave source generating the electromagnetic wave, the beam shape is not excessively limited here. In this embodiment, the spherical beam is used as an example, but it is not limited to it. Through the lens 190, the beam can be further converted into a plane beam to obtain a beam of a cylindrical shape like a pencil, a fan-out shape, or other shapes, so as to improve the directivity of the beam through the lens 190, thereby enhancing the directional gain of the electromagnetic wave, and reducing the attenuation and loss of the electromagnetic wave from the antenna through the lens 190.

As an example, the antenna 180 includes one or a combination of a transmitting antenna, a receiving antenna, and a transceiver antenna.

Figure 18:
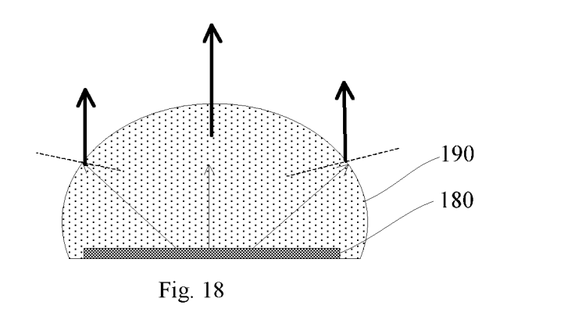
FIG. 18 shows a principle view of the lens antenna packaging structure when transmitting electromagnetic signals according to the present disclosure.
Figure 19:
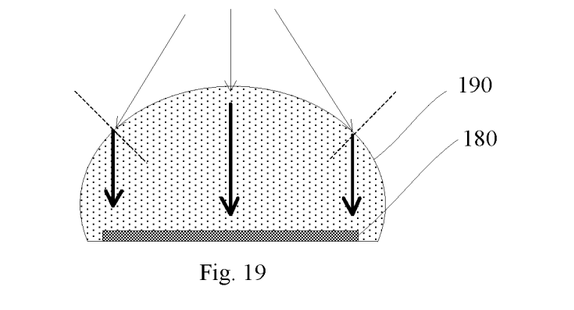
FIG. 19 shows a principle view of the lens antenna packaging structure when receiving electromagnetic signals according to the present disclosure.

Specifically, as shown in FIG. 18, when the antenna 180 serves as a transmitting antenna that transmits signals, the antenna 180 is the source of waves. The electromagnetic waves emitted by the antenna 180 enters the air medium after passing through the lens 190, the beam of waves will be converged, thereby converting the beam from a divergent spherical wave to a parallel planar beam. As shown in FIG. 19, when the antenna 180 serves as a receiving antenna and receives signals, other antennas located in the air medium serve as wave sources, the beam emitted by the antenna located in the air medium passes through the lens 190, and the beam will also be converged, thereby converting the beam from a divergent spherical wave to a parallel planar beam. The antenna 180 can also be a transceiver antenna that can transmit and receive signals as needed. Similarly, through the lens 190, the beam can be converted to focus or defocus into a parallel planar beam.

As an example, the lens 190 includes a convex lens with a refractive index ranging from 1.1 to 2.0.

Figure 15:
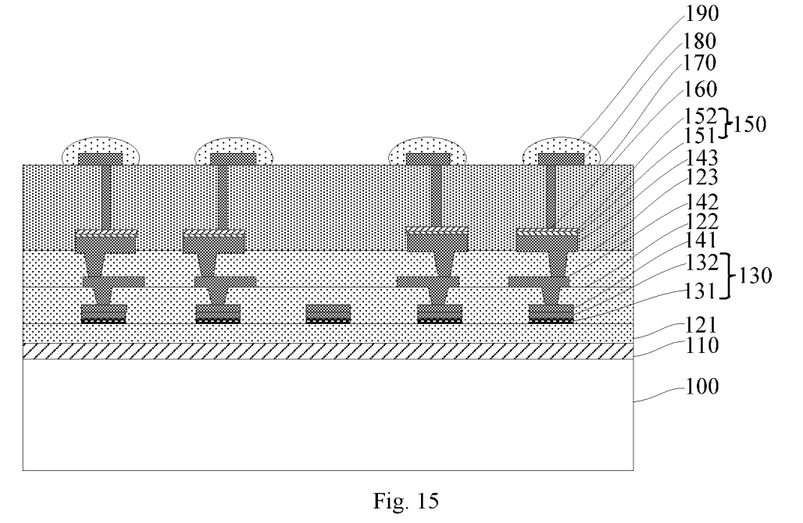
Figure 16:
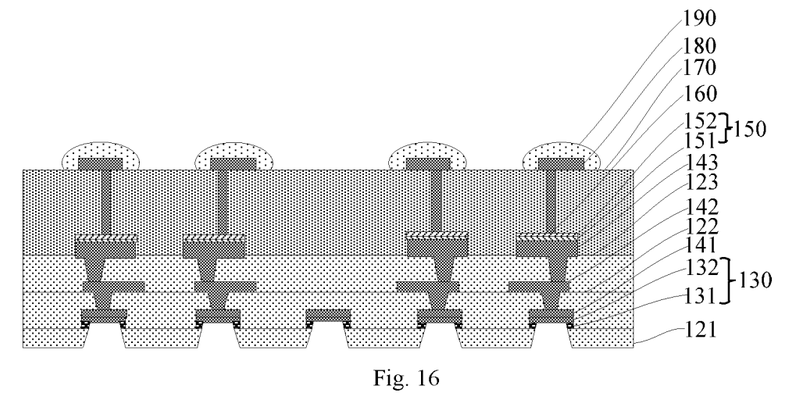

Specifically, as shown in FIGS. 15-17, in this embodiment, the lens 190 is a convex lens, and the refractive index of the lens 190 at the electromagnetic waves from the antenna ranges from 1.1 to 2.0, such as 1.5, 1.8, etc. Further, the lens 190 may include one or a combination of a polyimide (PI) lens with a refractive index range greater than 1.68, a silicone lens with a refractive index ranging from 1.41 to 1.54, a Polymethyl methacrylate (PMMA) lens with a refractive index of 1.49, a Polyethylene terephthalate (PET) lens with a refractive index of 1.65, and a Perspective Control (PC) lens with a refractive index of 1.59. In another embodiment, the lens 190 may also be a concave lens according to needs, which is not excessively restricted here.

As an example, the cross-section shape of the lens 190 includes one or a combination of a circle, an ellipse, a square, a triangle, and a trapezoid, which can be specifically selected according to needs. In this embodiment, the cross-section shape of the lens 190 is circular, but it is not limited thereto.

As an example, the lens antenna packaging structure further includes a metal connector 150 disposed between the feeder line 160 and the rewiring layer stack, and the metal connector 150 electrically connects the rewiring layer stack and the feeder line 160.

Specifically, as shown in FIG. 17, the metal connector 150 includes a nickel (Ni) layer 151 and a gold (Au) layer 152 that are stacked. The Ni layer 151 is electrically connected with the top surface of the rewiring layer stack, and the Au layer 152 is electrically connected with the first end of the feeder line 160, so that the feeder line 160 is in good contact with the rewiring layer stack through the metal connector 150. Preferably, at the interface of the metal connector 150 and the feeder line 160, the contact area of the metal connector 150 is greater than or equal to the contact area of the feeder line 160.

As an example, the lens antenna packaging structure further includes a filling layer 210 between the chip 200 and the rewiring layer stack, to improve the bonding strength between the chip 200 and the rewiring layer stack, and protect the rewiring layer stack and the chip 200 from oxidation and moisture absorption. The material of the filling layer 210 includes epoxy resin.

As an example, the rewiring layer stack includes a wiring dielectric layer and a wiring metal layer stacked in sequence. The material of the wiring dielectric layer includes one or combination of epoxy, silicone rubber, PI, polybenzoxazole (PBO), benzocyclobutene (BCB), silicon oxide, phosphorosilicate glass, and fluorine-containing glass. The material of the wiring metal layer includes one or a combination of copper, aluminum, nickel, gold, silver, and titanium.

Specifically, in this embodiment, the wiring dielectric layer includes a first wiring dielectric layer 121, a second wiring dielectric layer 122, and a third wiring dielectric layer 123. The wiring metal layer includes a first wiring metal layer 141, a second wiring metal layer 142 and a third wiring metal layer 143. As an example, to simplify process and reduce cost, the wiring dielectric layers 121, 122, and 123 may all use the same material of PI, and the wiring metal layers 141, 142, 143 may all use the same material of copper, however, the selection of number and material of the wiring dielectric layers and the wiring metal layers in the rewiring layer stack is not limited to the above examples.

As an example, a seed layer 130 may further be included between the first wiring metal layer 141 and the first wiring dielectric layer 121, and the seed layer 130 may include two sub-layers, a titanium (Ti) layer 131 and a Cu layer 132.

Specifically, the Ti layer 131 is in contact with the first wiring dielectric layer 121, the Cu layer 132 is in contact with the first wiring metal layer 141. The seed layer 130 can improve the contact adhesion between the first wiring metal layer 141 and the first wiring dielectric layer 121.

As an example, the material of the feeder line 160 includes one or a combination of gold, silver, copper, and aluminum. The material of the antenna 180 includes one or a combination of gold, silver, copper and aluminum. The material of the plastic encapsulation layer 170 includes one or a combination of polymer, polyimide, silicone, and epoxy resin. The material of the protruded solder ball 220 includes tin-containing metal.

As an example, the chip 200 may include one of an active chip and a passive chip, and may be specifically selected according to needs. For example, the chip 200 may include one or a combination of an active component and a passive component. The active component may include one or a combination of a Power Management IC (PMIC), a transmission chip, and a receiver chip. The passive components may include one or a combination of resistor, capacitor, and inductor.

Another embodiment according to the disclosure provides an electronic device including the above lens disclosed antenna packaging structure. The electronic device may be a mobile phone, a base station, a computer, a phone watch, a smart home, etc. Through the lens 190, the directional gain of antenna electromagnetic waves can be enhanced, the attenuation and loss of electromagnetic waves of the antenna can be reduced, and it has significant energy-saving functions for 5G base stations and terminals.

Figure 1:
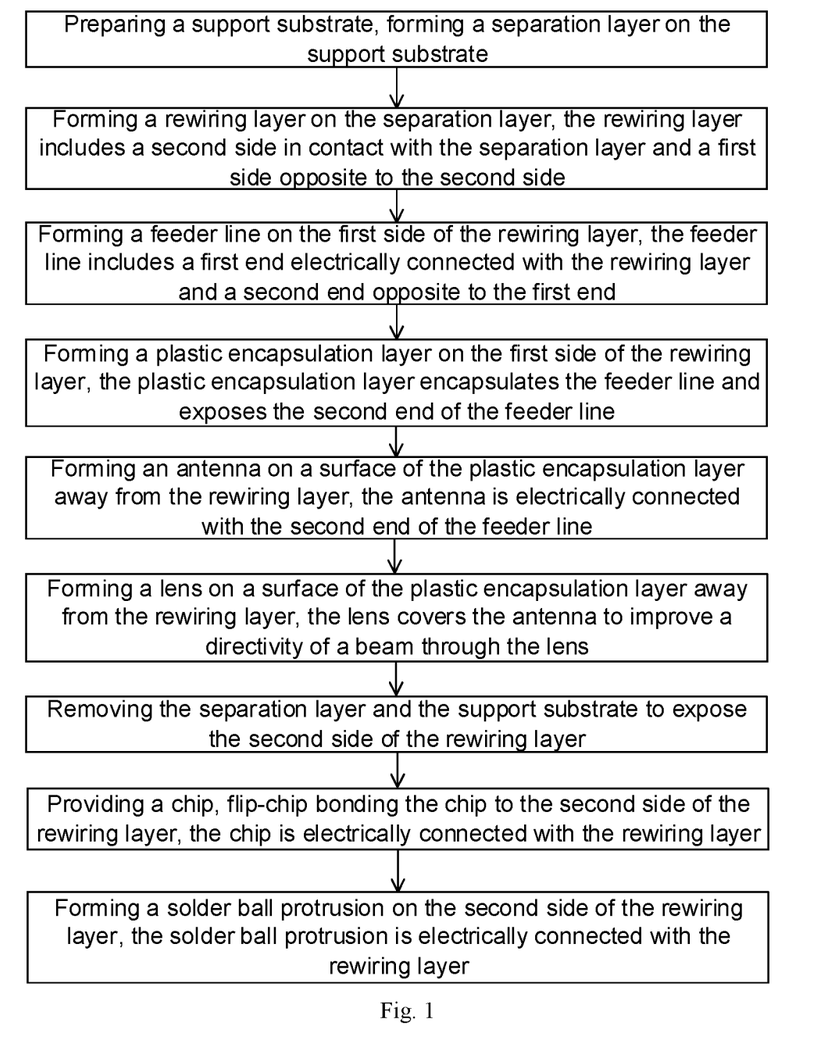
FIG. 1 shows a flowchart of a method for making a lens antenna packaging structure according to the present disclosure.

FIG. 1 illustrates a flow chart of the method for making a lens antenna packaging structure, according to another embodiment the disclosure. The method can be used to fabricate the above-disclosed lens antenna packaging structure, but the fabrication method of the above-disclosed lens antenna packaging structure is not limited to the flow chart in FIG. 1, which depicts merely an exemplary technique in making the lens antenna packaging structure. The material and structure of the lens antenna packaging structure will not be repeated here.

According to the disclosure, the method in FIG. 1 includes steps explained below along with the accompanying FIGS. 2-17.

Figure 2:
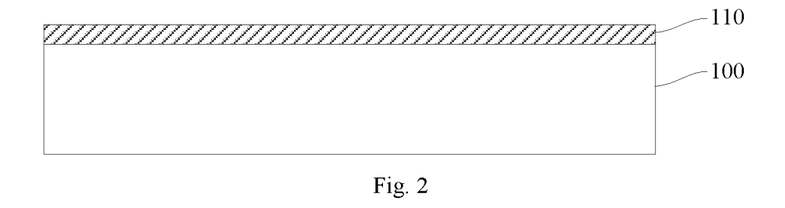
FIGS. 2 to 17 show the schematic cross-sectional views of the structure obtained post each step of the process in making the lens antenna packaging structure according to the present disclosure.

As shown in FIG. 2, first, a support substrate 100 is prepared, and a separation layer 110 is formed on the support substrate 100.

As an example, the support substrate 100 may include one or more materials of silicon, glass, silicon oxide, ceramic, polymer and metal, and the shape of the support substrate 100 may be round, square or any other desired shapes. Preferably, in this embodiment, the support substrate 100 is a silicon material with a round shape, and the diameter is preferably 300 mm, but it is not limited thereto.

As an example, the separation layer 110 may include a polymer layer or an adhesive layer such as a tape.

Specifically, for example, the separation layer 110 may have material of a double adhesive film with an adhesive on both sides, one side is bonded by an automatic patching process. Alternatively, the separation layer 110 may have an adhesive layer disposed by a spin coating process. In this embodiment, the separation layer 110 preferably has a polymer layer of the light-to-heat conversion (LTHC) property, so that in the subsequent operations, the LTHC layer can be heated by a laser, so that the support substrate 100 is separated from the LTHC layer. In other examples, the separation layer 110 may be made of other materials formed by physical vapor deposition (PVD) or chemical vapor deposition (CVD), such materials include epoxy, silicone rubber, polyimide (PI), polybenzoxazole (PBO), benzocyclobutene (BCB), etc. And the separation layer 110 can be removed in the subsequent removal process by using a grinding method, etc.

Referring to FIGS. 3 to 7, a rewiring layer stack of multiple layers is formed on the separation layer 110, the rewiring layer stack includes a second side in contact with the separation layer 110 and a first side opposite to the second side.

Figure 3:
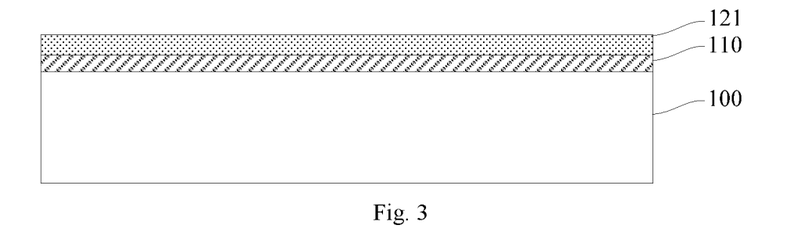

As an example, the forming of the rewiring layer stack on the separation layer 110 includes the following operations:

Referring to FIG. 3, processes of coating, exposure and baking are sequentially performed on the surface of the separation layer 110 to form a first wiring dielectric layer 121 on the separation layer 110.

Figure 4:
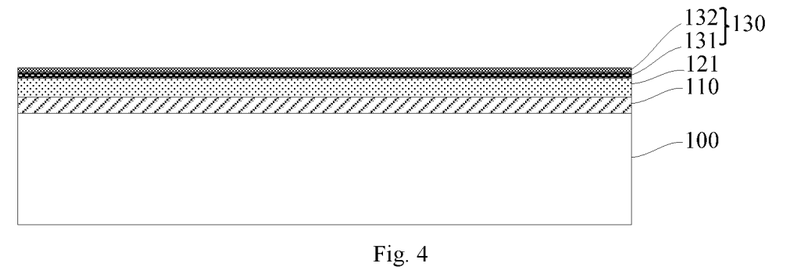

Referring to FIG. 4, a seed layer 130 of the next metal layer is formed on the surface of the first wiring dielectric layer 121. The method of forming the seed layer 130 may include a sputtering method. The seed layer 130 may include two sub-layers, a titanium (Ti) layer 131 and a Cu layer 132 as examples.

Figure 5:
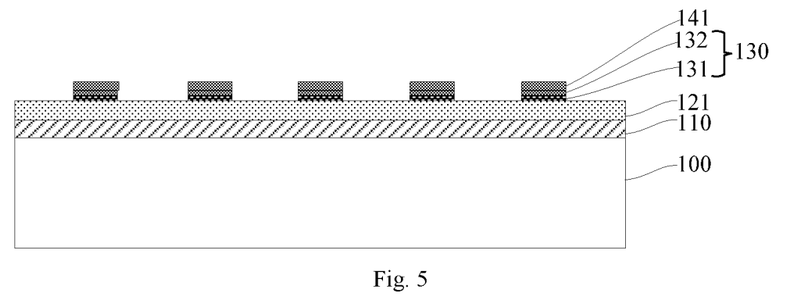

Referring to FIG. 5, a first wiring metal layer 141 is formed on the surface of the seed layer 130 which is built on the first wiring dielectric layer 121. The method of forming the first wiring metal layer 141 may be an electroplating process. For example, the choice of the seed layer 130 is for growing the metal layer 141 well. The seed layer may be formed on the surface of the first wiring dielectric layer 121. Then, a lithography process is performed including coating, exposing, and developing a photoresist, forming patterned photoresist (not shown) and etching. And the first wiring metal layer 141 is etched under the patterned photoresist. Then the photoresist is removed, and the metal layer 141 and the seed layer 130 are patterned, and the first wiring metal layer 141 is formed. The method may further include electrical and visual inspection operations to check on defects and improve process integrity.

Figure 6:
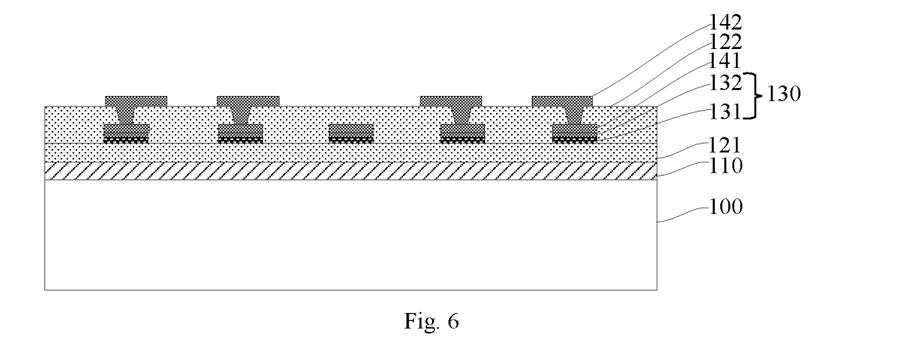

Referring to FIG. 6, the second wiring dielectric layer 122 and the second wiring metal layer 142 are disposed.

Specifically, the lithographic operations of coating, exposure, development and baking photoresist are sequentially performed to pattern the second wiring dielectric 122 on the first wiring dielectric layer 121. The second wiring metal layer 142 is formed on the surface of the second wiring dielectric layer 122. The patterning process may be followed by electrical and visual inspection operations to check on defects and improve the process.

Figure 7:
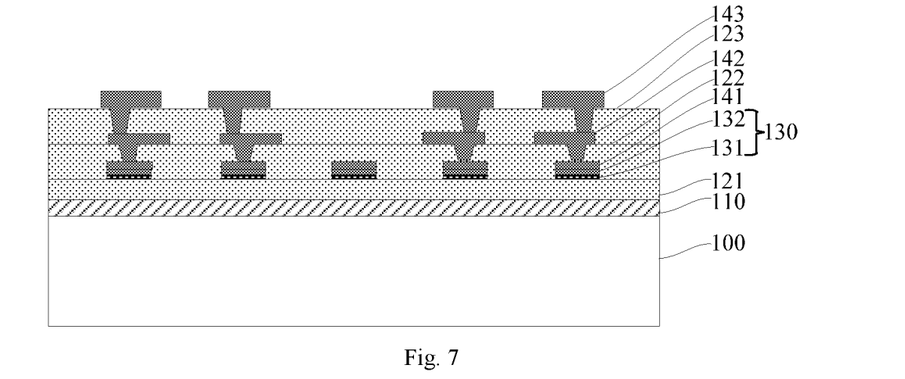

Referring to FIG. 7, the third wiring dielectric layer 123 and the third wiring metal layer 143 are formed.

Specifically, the lithographic operations of coating, exposure, development and baking photoresist are sequentially performed to pattern the third wiring dielectric 123 on the second wiring dielectric layer 122. The third wiring metal layer 143 is formed on the surface of the third wiring dielectric layer 123. The patterning process may be followed by electrical and visual inspection operations to check on defects and improve the process.

Figure 9:
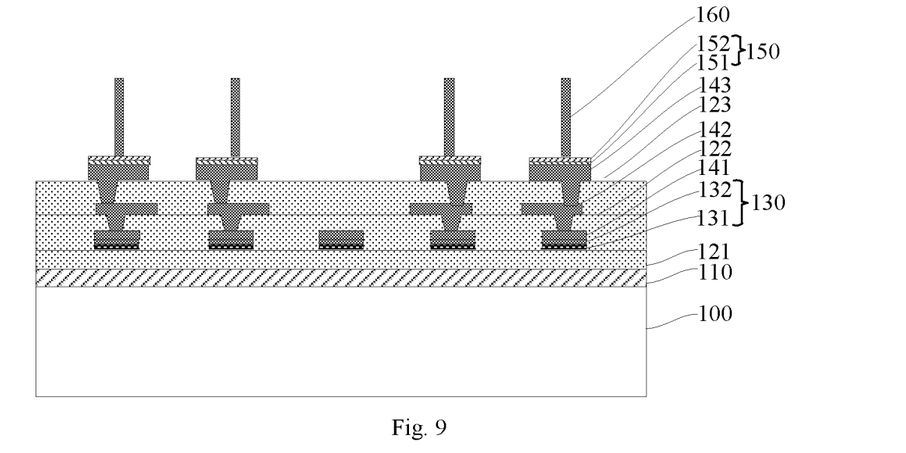

Referring to FIG. 9, a feeder line 160 is formed on the first side of the rewiring layer stack. The feeder line 160 includes a first end electrically connected with the rewiring layer stack and a second end opposite to the first end.

Specifically, the feeder line 160 may be formed by one or a combination of wire bonding, electroplating, and electroless plating. The wire bonding method may include, for example, one or a combination of hot-press wire bonding process, ultrasonic wire bonding process, and hot-press ultrasonic wave wire bonding process. The number and location distribution of the feeder line 160 can be set according to actual needs. In FIG. 9, only four feeder lines 160 are shown as examples. In a practical example, the number of the feeder line 160 is not limited to only four lines.

Figure 8:
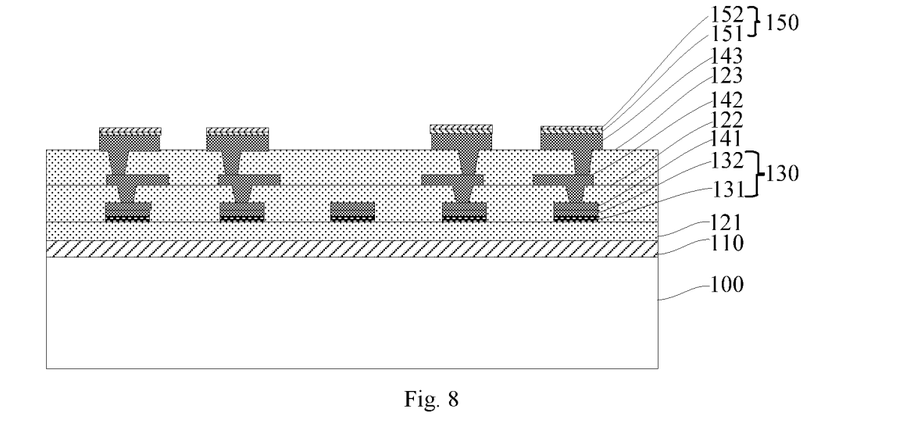

As an example, the method further includes: forming a metal connector 150 after forming the rewiring layer stack and before forming the feeder line 160, to electrically connect the rewiring layer stack and the feeder line 160. Referring to FIG. 8. The method of forming the metal connector 150 may use one of electroplating, electroless plating, PVD, and CVD. The method may further include electrical and visual inspection operations.

Figure 10:
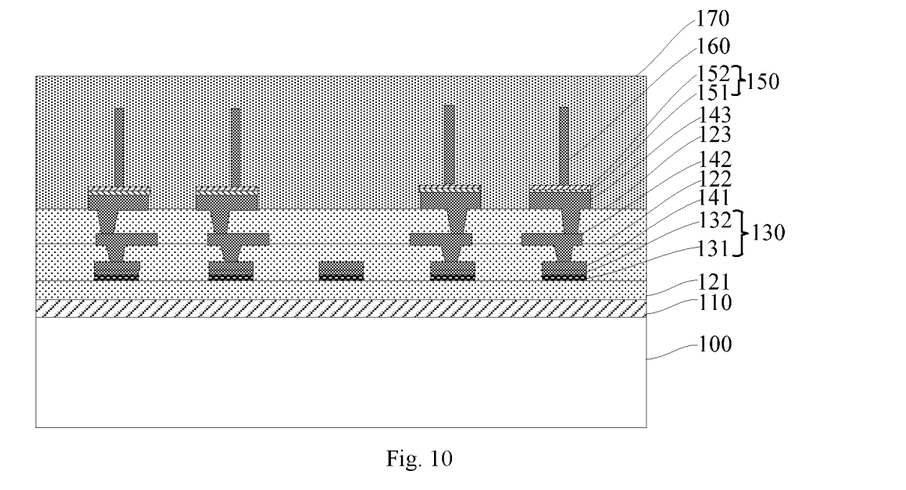
Figure 11:
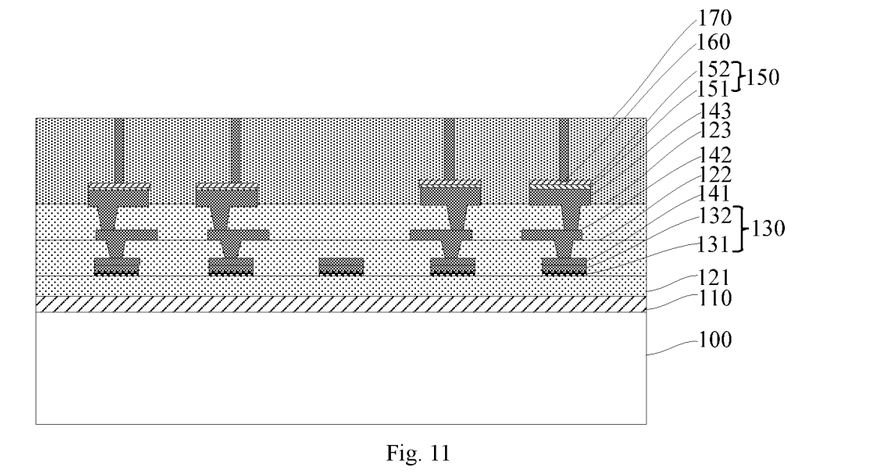

Referring to FIGS. 10-11, a plastic encapsulation layer 170 is formed on the first side of the rewiring layer stack to encapsulate the feeder line 160, and the plastic encapsulation layer 170 exposes the second end of the feeder line 160. The method of forming the plastic encapsulation layer 170 is preferably a molding method which can build a plastic encapsulation layer 170 with an accurate size.

Specifically, the top surface of the initially formed plastic encapsulation layer 170 may be above the second end of the feeder line 160. Referring to FIG. 10, at this time, after forming the plastic encapsulation layer 170, the plastic encapsulation layer 170 needs to be thinned. The plastic encapsulation layer 170 may be thinned using, but not limited to, a chemical mechanical planarization (CMP) process, so that the surface of the remaining plastic encapsulation layer 170 is leveled with the second end or the top surface of the feeder line 160, as shown in FIG. 11. In other examples, the surface of the initially formed plastic encapsulation layer 170 may also be leveled with the surface of the feeder line 160, so the process of thinning the plastic encapsulation layer 170 may be saved.

Figure 12:
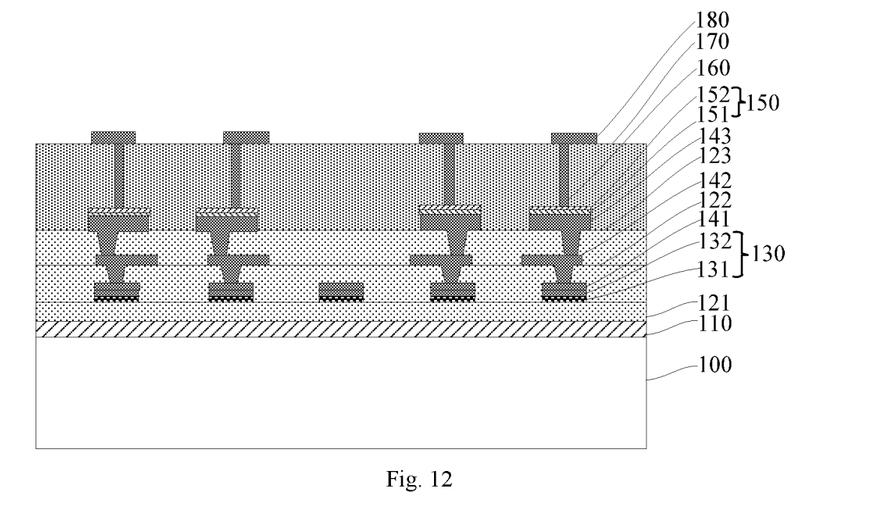

Referring to FIG. 12, then an antenna 180 is formed on the top surface of the plastic encapsulation layer 170 away from the rewiring layer stack, the antenna 180 is electrically connected with the second end of the feeder line 160. The method of forming the antenna 180 may use one of electroplating, electroless plating, PVD, and CVD. The method may further include electrical and visual inspection operations.

Figure 13:
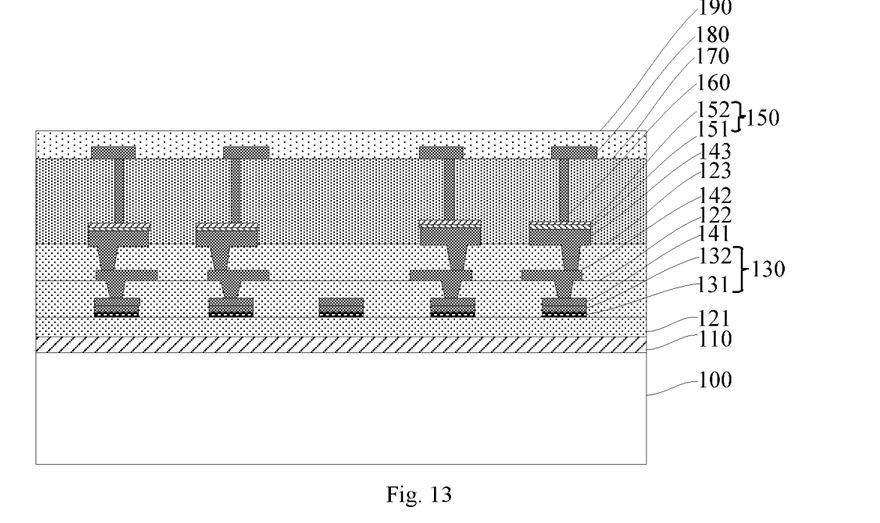
Figure 14:
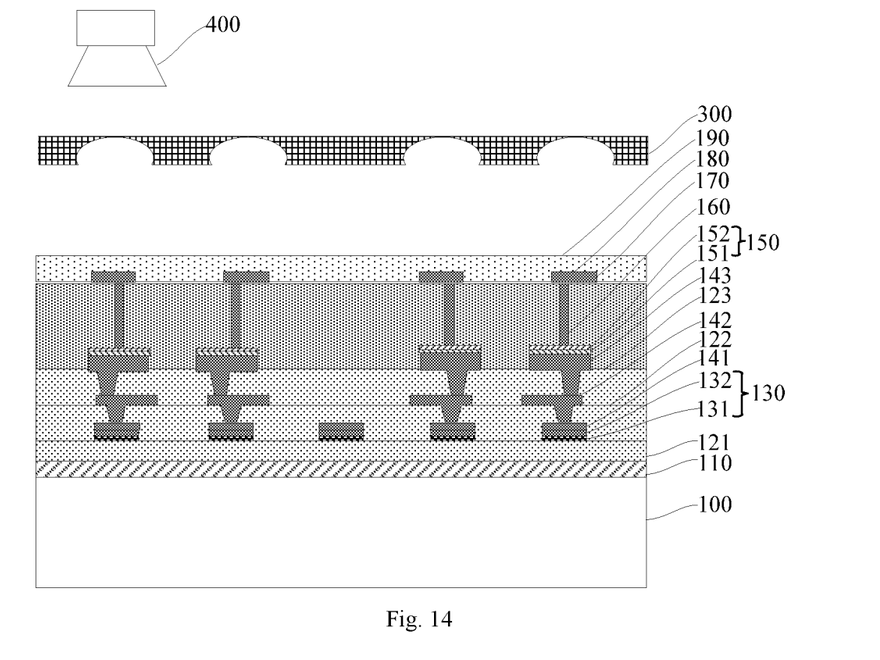

Referring to FIGS. 13-15, a lens 190 is formed on the surface of the plastic encapsulation layer 170 away from the rewiring layer stack, the lens 190 covers the antenna 180 to improve the directivity of the beam through the lens 190.

As an example, a method of forming the lens 190 includes one ora combination of 3D lithography, laser etching, and molding.

Specifically, in this embodiment, the lens 190 is formed by 3D lithography, which includes: coating the material of the lens 190 on the top surface of the plastic encapsulation layer 170 away from the rewiring layer stack, then performing a lithographic process of exposure and development of photoresist by using a mask 300, in FIG. 14, under the radiation of light 400, to form the patterned lens 190, as shown in FIG. 15. In another embodiment, after coating the material of the lens 190, laser etching may also be used directly to form the patterned lens 190. Or another way to make the lens 190 is by direct molding.

Referring to FIG. 16, then the separation layer 110 and the support substrate 100 are removed to expose the second side of the rewiring layer stack.

Specifically, after the separation layer 110 and the support substrate 100 are removed, a laser drilling method may be used to form a groove in the first diectric layer 121 that exposes the Ti layer 131, then a remote plasma treatment may be used for purification pretreatment, and the exposed Ti layer 131 is further etched to expose the Cu layer 132 as a metal contact pad for subsequent electrical connection elements.

Referring to FIG. 17, then a chip 200 is provided, the chip 200 is flip-chip bonded to the second side of the rewiring layer stack, and the chip 200 is electrically connected with the rewiring layer stack. A protruded solder ball 220 electrically connected to the rewiring layer stack is formed on the second side of the rewiring layer stack.

Specifically, the chip 200 is preferably bonded by a flip-chip bonding process, then the protruded solder ball 220 is planted, and the reflow soldering and cleaning operations are performed, to fix the chip 200 and the protruded solder ball 220. Preferential bonding of the chip 200 can reduce ambient moisture and impurities into the metal contact pad of the chip 200 to improve the hermetical seal. And it is preferable that the protruded solder ball 220 exerts out from the surface of the chip 200 to facilitate subsequent electrical connection.

As an example, the method may further include: forming a filling layer 210 between the chip 200 and the second side of the rewiring layer stack, to improve the bonding strength of the chip 200 and the rewiring layer stack and protect the wiring layer and the chip 200.

In summary, the present disclosure provides a lens antenna packaging structure, a preparation method and an electronic device. The lens antenna packaging structure includes a rewiring layer stack, a feeder line, a plastic encapsulation layer, an antenna, a lens, a chip and a protruded solder ball. The lens covers the antenna, such that one or a combination of the spherical beam and the cylindrical beam radiated initially from the device will converge after being refracted by the lens, and finally form a desired beam such as a planar wave to improve the directivity of the beam through the lens, which can enhance the directional gain of electromagnetic waves through the lens, reduce the attenuation and loss of the electromagnetic waves of the antenna, and have a significant energy saving function for 5G base stations and terminals.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:
1. A lens antenna packaging structure, comprising:
  a rewiring layer stack, including a first side and a second side opposite to the first side;
  a feeder line disposed on the first side of the rewiring layer stack, wherein the feeder line comprises a first end electrically connected with the rewiring layer stack and a second end opposite to the first end;

a plastic encapsulation layer disposed on the first side of the rewiring layer stack, encapsulating the feeder line and exposing the second end of the feeder line;

an antenna disposed on a surface of the plastic encapsulation layer away from the rewiring layer stack, wherein the antenna is electrically connected to the second end of the feeder line and emits an initial beam of electromagnetic waves;

a lens disposed on an outer surface of the antenna away from the plastic encapsulation layer, wherein the lens refracts the initial beam to an output beam of a desired shape;

a chip flip-chip bonded to the second side of the rewiring layer stack and electrically connected to the rewiring layer stack; and a protruded solder ball disposed on the second side of the rewiring layer stack and electrically connected with the rewiring layer stack.

2. The lens antenna packaging structure according to claim 1, wherein the initial beam of electromagnetic waves comprises one or a combination of a spherical form and a cylindrical form, and wherein the initial beam is refracted into a planar beam through the lens.

3. The lens antenna packaging structure according to claim 1, wherein the antenna comprises one or a combination of a transmitting antenna, a receiving antenna, and a transceiver antenna.

4. The lens antenna packaging structure according to claim 1, wherein the lens comprises a convex lens with a refractive index ranging from 1.1 to 2.0.

5. The lens antenna packaging structure according to claim 1, wherein the lens includes one or a combination of a PI lens, a silicone lens, a PMMA lens, a PET lens, and a PC lens.

6. The lens antenna packaging structure according to claim 1, wherein a foot print of the lens on the plastic encapsulated layer includes one or a combination of a circle, an ellipse, a square, a triangle, and a trapezoid.

7. The lens antenna packaging structure according to claim 1, further comprising: a metal connector disposed between the feeder line and the rewiring layer stack and electrically connecting the rewiring layer stack and the feeder line.

8. An electronic device, comprising a lens antenna packaging structure, wherein the lens antenna packaging structure includes:

a rewiring layer stack, including a first side and a second side opposite to the first side;

a feeder line disposed on the first side of the rewiring layer stack, wherein the feeder line comprises a first end electrically connected with the rewiring layer stack and a second end opposite to the first end;

a plastic encapsulation layer disposed on the first side of the rewiring layer stack, encapsulating the feeder line and exposing the second end of the feeder line;

an antenna disposed on a surface of the plastic encapsulation layer away from the rewiring layer stack, wherein the antenna is electrically connected to the second end of the feeder line and emits an initial beam of electromagnetic waves;

a lens disposed on an outer surface of the antenna away from the plastic encapsulation layer, wherein the lens refracts the initial beam to an output beam of a desired shape;

a chip flip-chip bonded to the second side of the rewiring layer stack and electrically connected with the rewiring layer stack; and a protruded solder ball disposed on the second side of the rewiring layer stack and electrically connected with the rewiring layer stack.

9. A method for making a lens antenna packaging structure, comprising:

providing a support substrate, forming a separation layer on the support substrate;

forming a rewiring layer stack on the separation layer, wherein the rewiring layer stack includes a second side in contact with the separation layer and a first side opposite to the second side;

forming a feeder line on the first side of the rewiring layer stack, wherein the feeder line includes a first end electrically connected with the rewiring layer stack and a second end opposite to the first end;

forming a plastic encapsulation layer on the first side of the rewiring layer stack, the plastic encapsulation layer encapsulates the feeder line and exposes the second end of the feeder line;

forming an antenna on a surface of the plastic encapsulation layer away from the rewiring layer stack, wherein the antenna is electrically connected with the second end of the feeder line and emits an initial beam of electromagnetic waves;

forming a lens on an outer surface of the plastic encapsulation layer away from the rewiring layer stack, wherein the lens refracts the initial beam to a desired shape;

removing the separation layer and the support substrate to expose the second side of the rewiring layer stack;

flip-chip bonding a chip to the second side of the rewiring layer stack, wherein the chip is electrically connected with the rewiring layer stack; and forming a protruded solder ball on the second side of the rewiring layer stack, wherein the protruded solder ball is electrically connected with the rewiring layer stack.

10. The method for making the lens antenna packaging structure according to claim 9, wherein a method of forming the lens includes one or a combination of 3D lithography, laser etching, and molding.

11. The method for making the lens antenna packaging structure according to claim 9, wherein the initial beam of electromagnet waves from the antenna comprises one or a combination of a spherical beam and a cylindrical beam, and wherein the initial beam is converted into a planar beam through the lens.

12. The method for making the lens antenna packaging structure according to claim 9, wherein the antenna comprises one or a combination of a transmitting antenna, a receiving antenna, and a transceiver antenna.

13. The method for making the lens antenna packaging structure according to claim 9, wherein the lens comprises a convex lens with a refractive index ranging from 1.1 to 2.0 for the electromagnet waves in the initial beam.

14. The method for making the lens antenna packaging structure according to claim 9, wherein the formed lens includes one or a combination of a PI lens, a silicone lens, a PMMA lens, a PET lens, and a PC lens.

15. The method for making a lens antenna packaging structure according to claim 9, wherein a foot print of the lens on the plastic encapsulated layer includes one or a combination of a circle, an ellipse, a square, a triangle, and a trapezoid.

16. The method for making a lens antenna packaging structure according to claim 9, further comprising: forming a metal connector after forming the rewiring layer stack and before forming the feeder line, to electrically connect the rewiring layer stack and the feeder line through the metal connector.

* * * * *